US006765831B2

United States Patent
Oikawa et al.

(10) Patent No.: US 6,765,831 B2
(45) Date of Patent: Jul. 20, 2004

(54) SEMICONDUCTOR INTEGRATED CIRCUIT DEVICE

(75) Inventors: Kohei Oikawa, Kamakura (JP); Shinichiro Shiratake, Yokohama (JP); Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/428,763

(22) Filed: May 5, 2003

(65) Prior Publication Data

US 2004/0076066 A1 Apr. 22, 2004

(30) Foreign Application Priority Data

Oct. 17, 2002 (JP) ........................................ 2002-302754

(51) Int. Cl.[7] .............................................. G11C 8/00
(52) U.S. Cl. ................... 365/200; 365/189.05
(58) Field of Search ..................... 365/230.06, 189.05

(56) References Cited

U.S. PATENT DOCUMENTS 5,887,272 A * 3/1999 Sartore et al. ......... 365/230.08
6,038,162 A    3/2000 Takata et al.
6,301,145 B1  10/2001 Nishihara
6,473,352 B2 * 10/2002 Nishino et al. ............ 365/221

FOREIGN PATENT DOCUMENTS

JP          2000-349248     12/2000

OTHER PUBLICATIONS

Mun–Kyu Choi, et al. "A 0.25$\mu$m 3.0V 1T1C 32Mb Non-volatile Ferroelectric Ram With Address Transition Detector(ATD) and Current Forcing Latch Sense Amplifier(C-FLSA) Scheme," 2002 IEEE International Solid–State Circuits Conference, Vol. 1, 2002, pp. 162–163.

* cited by examiner

Primary Examiner—Richard Elms
Assistant Examiner—Tuan Nguyen
(74) Attorney, Agent, or Firm—Oblon, Spivak, McClelland, Maier & Neustadt, P.C.

(57) ABSTRACT

A semiconductor integrated circuit device includes a memory array, address buffer, address decoder, and controller. The memory array includes a memory cell array in which destructive read-out memory cells are integrated. The address buffer outputs an internal address signal corresponding to an input external address signal. The address decoder decodes the internal address signal and outputs a memory cell selection signal on the basis of the decode result. The controller parallel-executes wait processing of keeping the address buffer in a wait state until the lapse of a skew time after transition of the external address signal is detected, and decode processing until the memory cell selection signal changes from an invalid state to a valid state in response to output of the internal address signal.

18 Claims, 9 Drawing Sheets

SEMICONDUCTOR INTEGRATED CIRCUIT DEVICE

CROSS-REFERENCE TO RELATED APPLICATIONS

This application is based upon and claims the benefit of priority from the prior Japanese Patent Application No. 2002-302754, filed Oct. 17, 2002, the entire contents of which are incorporated herein by reference.

BACKGROUND OF THE INVENTION

1. Field of the Invention

The present invention relates to a semiconductor integrated circuit device and, more particularly, to a semiconductor integrated circuit device having a destructive read-out semiconductor memory in which cell data is destructed upon read.

2. Description of the Related Art

Semiconductor memory data read methods are roughly classified into destructive read-out and non-destructive read-out.

In destructive read-out, memory information is lost in data read and must be restored. Examples of destructive read-out semiconductor memories are a DRAM (Dynamic Random Access Memory) and FeRAM (Ferroelectric Random Access Memory). Known examples of an FeRAM are disclosed in Jpn. Pat. Appln. KOKAI Publication No. 2000-349248 and U.S. Pat. No. 6,038,162.

In non-destructive read-out, memory information is not lost in data read and need not be restored. Examples of non-destructive read-out semiconductor memories are, an SRAM (Static Random Access Memory) and EEPROM (Electrically Erasable Programmable Read Only Memory).

Semiconductor memory interfaces are classified into two types: a synchronous interface and asynchronous interface.

The synchronous interface starts operation in response to, e.g., input of a sync signal such as a RAS (Row Address Strobe) signal or CAS (Column Address Strobe) signal. The asynchronous interface shifts to the next operation in response to transition of an external address signal.

A general non-destructive read-out semiconductor memory can shift to the next operation within a time shorter than the cycle time even if the address changes during read operation. This implements an asynchronous interface which shifts to the next operation in response to transition of an external address signal.

To the contrary, once read operation starts, a destructive read-out semiconductor memory cannot shift to the next operation until data is restored in a cell. For this reason, the destructive read-out semiconductor memory generally adopts a synchronous interface which operates in response to, e.g., input of a sync signal.

To implement an asynchronous interface in the destructive read-out semiconductor memory, memory array operation starts a predetermined time (to be referred to as a skew time hereinafter) after transition of an external address is detected. Within a chip, the operation waits for the skew time after transition of an external address signal is detected. If no address changes during this period, memory operation starts. An example of the operation sequence is shown in FIG. 13.

Figure 13:
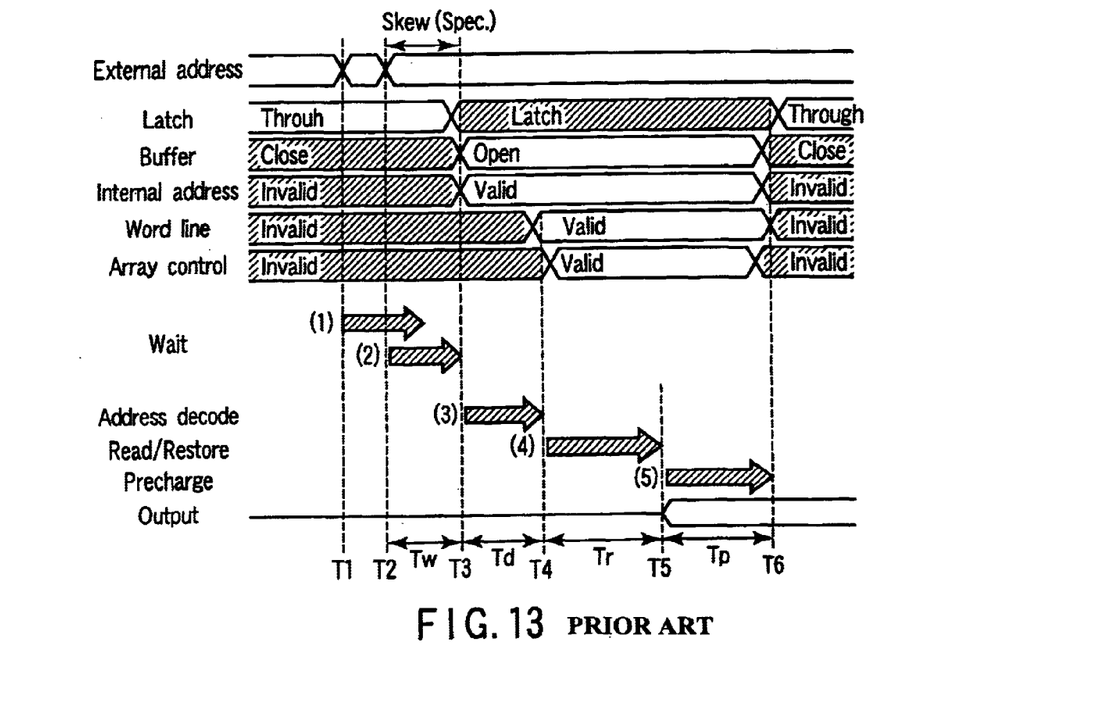
FIG. 13 is a signal transition diagram showing the operation of a conventional semiconductor integrated circuit device.

As shown in FIG. 13, an external address signal changes at time T1. An address buffer waits for a skew time Tw after the address transition (Wait: arrow (1)). The address buffer waits by changing a latch circuit (latch) in the address buffer to a through state (through), a buffer circuit (buffer) in the address buffer to a close state (close), and an internal address signal (Internal Address) to an invalid state (Invalid).

At time T2 before the lapse of the skew time Tw, the external address signal changes again. The address buffer waits for another skew time Tw after this address transition (arrow (2)).

If no address changes by time T3 upon the lapse of the skew time Tw, the address buffer shifts to the next operation. At time T3, the latch circuit changes from the through state to the latch state (latch), and an output from the latch circuit is fixed. The buffer circuit is changed from the close state to an open state (open), and the internal address signal is changed from the invalid state to a valid state (Valid). Accordingly, decode processing (Address decode) of the internal address signal starts (arrow (3)).

Upon the lapse of a decode time Td from time T3, decode processing ends, and a corresponding word line (Word Line) changes from the invalid state (Invalid) to the valid state (Valid). At corresponding time T4, a memory array control signal (Array Control) for controlling the memory array changes from the invalid state (Invalid) to the valid state (Valid), and memory array control starts. Read/restore operation (Read/Restore: arrow (4)) is performed, and precharge operation (Precharge: arrow (5)) and data output (Output) are executed from time T5. At time T6, one cycle ends.

The asynchronous memory interface which performs this operation waits for the skew time Tw until memory operation actually starts after transition of an external address signal. The access time is prolonged by the skew time Tw, compared to the synchronous memory interface which starts operation in synchronism with a chip enable signal or the like.

In the operation sequence shown in FIG. 13, let Tw be the skew time; Td, the decode time necessary for decode processing of an address signal; Tr, the read/restore time until data is output after memory array control starts; and Tp, the time (or precharge time) until the end of one cycle after data is output.

In this case, the access time of a semiconductor memory having a synchronous memory interface is given by $$Td+Tr$$

The cycle time is given by $$Td+Tr+Tp$$

To the contrary, the access time of a semiconductor memory having an asynchronous memory interface is prolonged to $$Tw+Td+Tr$$

The cycle time is prolonged to $$Tw+Td+Tr+Tp$$

BRIEF SUMMARY OF THE INVENTION

A semiconductor integrated circuit device according to an aspect of the present invention comprises: a memory array which includes a memory cell array in which destructive read-out memory cells are integrated; an address buffer which outputs an internal address signal corresponding to an input external address signal; an address decoder which decodes the internal address signal and outputs a memory cell selection signal for selecting the memory cell in the memory cell array on the basis of a decode result; and a controller which parallel-executes wait processing of keeping the address buffer in a wait state until lapse of a skew time after transition of the external address signal is detected, and decode processing until the memory cell selection signal changes from an invalid state to a valid state in response to output of the internal address signal.

DETAILED DESCRIPTION OF THE INVENTION

Embodiments of the present invention will be described below with reference to the several views of the accompanying drawing. In this description, the same reference numerals denote the same parts throughout the accompanying drawing.

FIRST EMBODIMENT

Figure 1A:
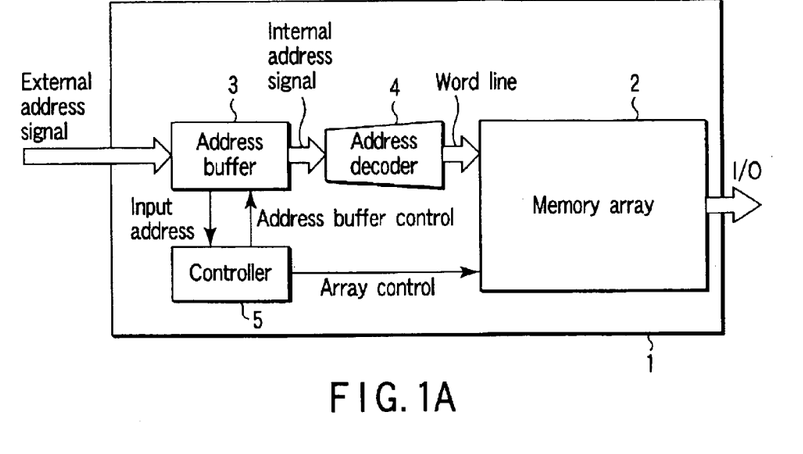
FIG. 1A is a block diagram showing a semiconductor integrated circuit device according to the first embodiment of the present invention.

FIG. 1A is a block diagram showing a semiconductor integrated circuit device according to the first embodiment of the present invention.

As shown in FIG. 1A, a memory array 2, address buffer 3, address decoder 4, and controller 5 are formed in a semiconductor integrated circuit chip 1.

The memory array 2 includes a memory cell array in which destructive read-out memory cells are integrated and arrayed in, e.g., a matrix.

Figure 2:
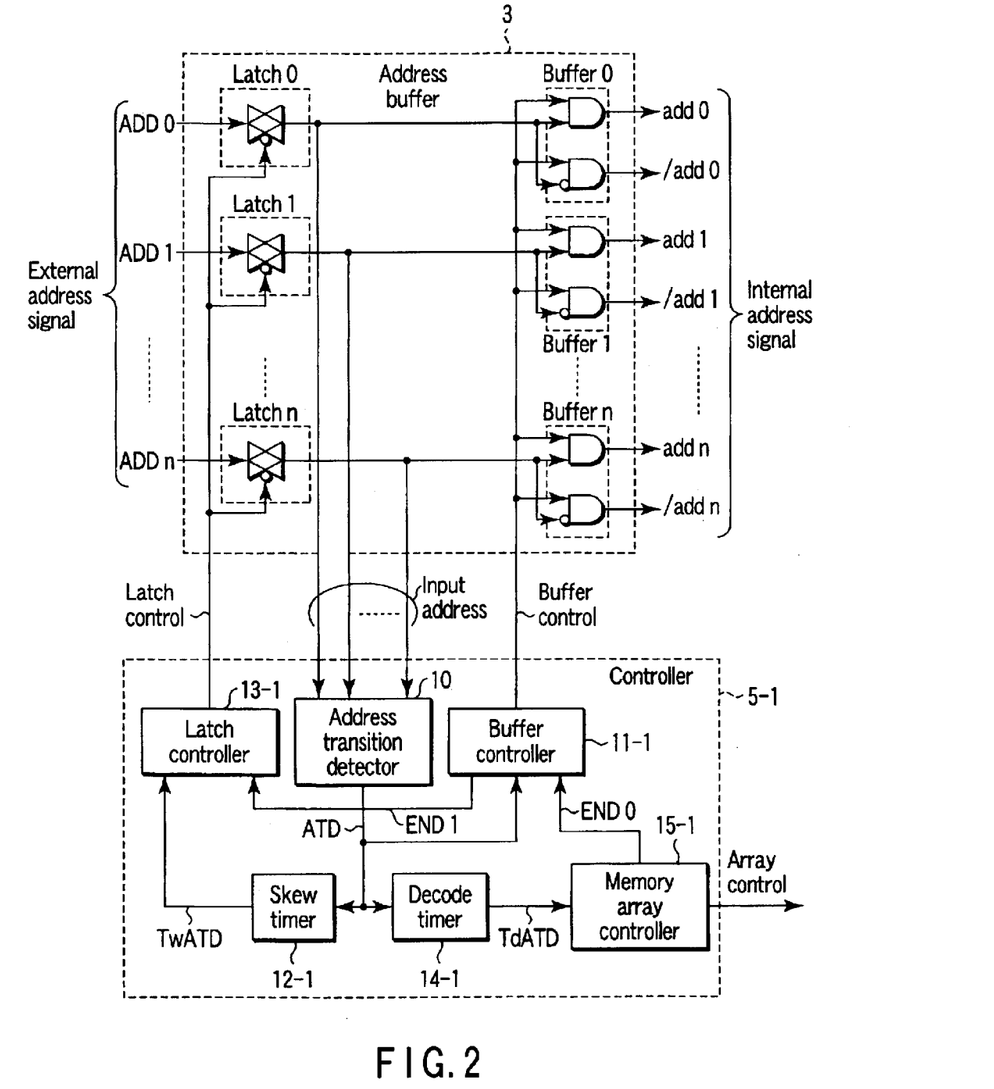
FIG. 2 is a block diagram showing arrangements of the address buffer and controller of the semiconductor integrated circuit device according to the first embodiment of the present invention.

The address buffer 3 receives an external address signal from the outside of the chip 1, and outputs an internal address signal corresponding to the received external address signal. FIG. 2 shows an arrangement of the address buffer 3.

As shown in FIG. 2, the address buffer 3 having this arrangement comprises latch circuits (Latch0 to Latchn) which receive external address signals ADD0 to ADDn, and buffer circuits (Buffer0 to Buffern) which receive outputs (Input Address) from the latch circuits and output internal address signals add0 to addn and /add0 to /addn. The internal address signals add0 to addn and /add0 to /addn are input to the address decoder 4.

The address decoder 4 decodes an input internal address signal. The address decoder 4 outputs a memory cell selection signal for selecting a memory cell in the memory cell array on the basis of the decode result. In this example, the memory cell selection signal is supplied to a word line.

The controller 5 receives an input external address signal (Input Address), and outputs an address buffer control signal (Address Buffer Control) for controlling the address buffer 3 and a memory array control signal (Array Control) for controlling the memory array 2. The address buffer control signal parallel-executes wait processing (Wait) and decode processing (Address decode). In wait processing, the address buffer 3 is kept in the wait state until the lapse of the skew time after transition of an external address signal is detected. Decode processing (Address decode) is performed until a memory cell selection signal changes from the invalid state to the valid state in response to the output of an internal address signal.

An example of the operation will be explained.

Figure 1B:
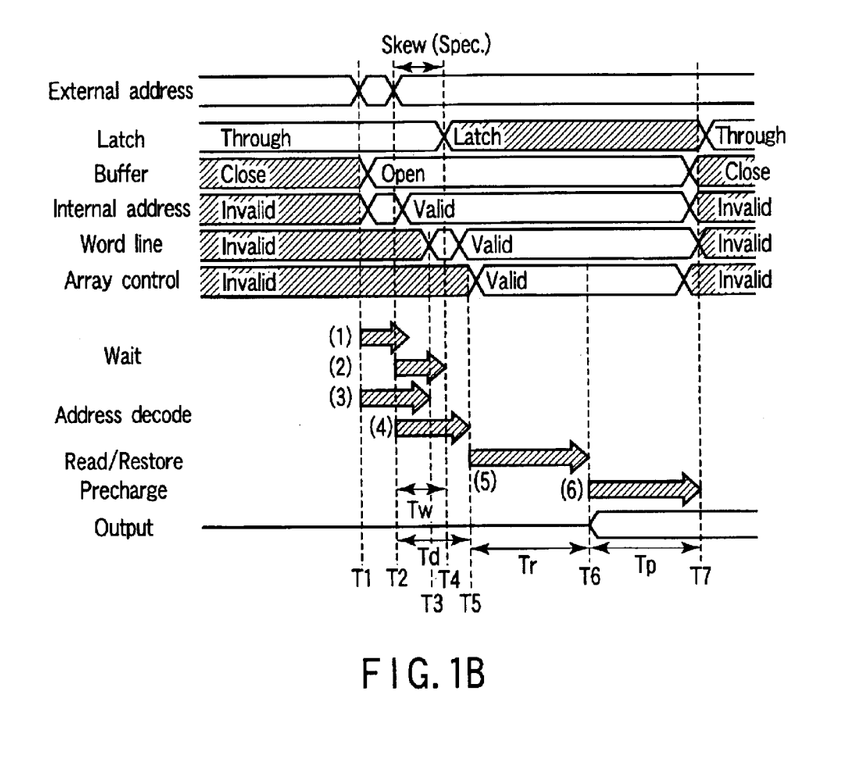
FIG. 1B is a signal transition diagram showing an operation of the semiconductor integrated circuit device according to the first embodiment of the present invention.

FIG. 1B is a signal transition diagram showing an operation of the semiconductor integrated circuit device according to the first embodiment of the present invention. As the premise of this operation, the memory array is made up of ferroelectric memory cells, and no cell data is destructed when the word line becomes active. The decode time Td necessary for decode processing is longer than a predetermined skew time Tw (Td>Tw). An external address signal is latched the skew time Tw after the final transition is detected. In other words, wait processing of keeping the address buffer 3 in the wait state is executed until the lapse of the skew time after the final transition of an external address signal is detected.

As shown in FIG. 1B, the first transition of an external address signal occurs at time T1. In response to this transition, the buffer of the address buffer changes from the close state (close) to the open state (open), and the internal address signal changes from the invalid state (Invalid) to the valid state (Valid). The address buffer 3 waits until the lapse of the predetermined skew time Tw (arrow (1)). At the same time, decode processing starts (arrow (3)).

At time T2 before the lapse of the skew time Tw, the next transition occurs. In response to this transition, the address buffer 3 waits again until the lapse of the skew time Tw (arrow (2)). At the same time, decode processing starts again (arrow (4)).

At time T4 upon the lapse of the skew time Tw after time t2, the address buffer changes to the latch state.

At time T5, decode processing ends. Because of the prerequisite (Td>Tw), the skew time Tw has elapsed when decode processing ends. Memory array operation starts from time T5, and for example, read/restore operation (Read/Restore: arrow (5)) and precharge (Precharge: arrow (6)) are performed.

In this operation, wait processing of wait processing and decode processing are parallel-executed, e.g., simultaneously executed. In wait processing, the address buffer 3 is kept in the wait state until the lapse of the skew time after transition of an external address signal is detected. Decode processing is performed until a memory cell selection signal changes from the invalid state to the valid state in response to the output of an internal address signal. The access time is the decode time Td+the read/restore time Tr. The cycle time is the decode time Td+the read/restore time Tr+the precharge time Tp.

The asynchronous memory interface which starts operation in response to transition of an external address signal can attain the same performance as that of the synchronous memory interface which starts operation in synchronism with, e.g., a chip enable signal.

An example of the semiconductor integrated circuit device according to the first embodiment will be described.

An example of the controller 5 according to the first embodiment will be explained.

FIG. 2 shows an example of a controller 5-1 according to the first embodiment.

As shown in FIG. 2, the controller 5-1 comprises an address transition detector 10, buffer controller 11-1, skew timer 12-1, latch controller 13-1, decode timer 14-1, and memory array controller 15-1.

The address transition detector 10 receives a latch output (Input Address) and outputs an address transition detection signal ATD. The signal ATD is input to the buffer controller 11-1, skew timer 12-1, and decode timer 14-1.

The buffer controller 11-1 receives the signal ATD, and activates a buffer control signal (Buffer Control). The buffer control signal is input to the buffer circuits (Buffer0 to Buffern) of the address buffer 3.

The active buffer control signal changes the buffer circuits (Buffer0 to Buffern) from the close state to the open state, as shown in FIG. 1B. The buffer circuits (Buffer0 to Buffern) output internal address signals add0 to addn and /add0 to /addn corresponding to the latch output (Input Address). Thereafter, decode processing (Address decode: arrows (3) and (4)) shown in FIG. 1B starts.

The skew timer 12-1 receives the signal ATD and measures a predetermined skew time Tw. The skew timer 12-1 includes a delay circuit which delays the signal ATD by a time corresponding to the skew time Tw. After the lapse of the skew time Tw, the skew timer 12-1 outputs a signal TwATD. The signal TwATD is input to the latch controller 13-1.

The latch controller 13-1 receives the signal TwATD and activates a latch control signal (Latch Control). The latch control signal is input to the latch circuits (Latch0 to Latchn) of the address buffer 3.

The active latch control signal changes the latch circuits (Latch0 to Latchn) from the through state (through) to the latch state (Latch), as shown in FIG. 1B. The latch circuits (Latch0 to Latchn) latch input external address signals to fix latch outputs (Input Address). Consequently, wait processing (Wait: arrows (1) and (2)) shown in FIG. 1B is canceled.

The decode timer 14-1 receives the signal ATD and measures the decode time Td necessary for decode processing. The decode timer 14-1 includes, e.g., a delay circuit which delays the signal ATD by a time corresponding to the decode time Td. The decode timer 14-1 outputs a signal TdATD upon the lapse of the decode time Td. The signal TdATD is input to the memory array controller 15-1.

The memory array controller 15-1 receives the signal TdATD and changes the memory array control signal (Array Control) from the invalid state (Invalid) to the valid state (Valid). The memory array control signal is input to the memory array 2.

The memory array 2 receives the memory array control signal and executes, e.g., read/restore operation (Read/Restore: arrow (5)) and precharge operation (Precharge: arrow (6)) shown in FIG. 1B.

After read/restore operation and precharge operation end, the memory array controller 15-1 changes the memory array control signal from the valid state to the invalid state. The memory array controller 15-1 outputs a signal END0 representing the end of operation. The signal END0 is input to the buffer controller 11-1.

The buffer controller 11-1 receives the signal END0 and inactivates the buffer control signal.

The inactive buffer control signal changes the buffer circuits (Buffer0 to Buffern) from the open state to the close state, as shown in FIG. 1B. The internal address signal then changes from the valid state to the invalid state.

The buffer controller 11-1 outputs, e.g., a signal END1. The signal END1 is input to the latch controller 13-1.

The latch controller 13-1 receives the signal END1 and inactivates the latch control signal.

In response to the inactive latch control signal, the latch circuits (Latch0 to Latchn) return from the latch state to the through state, as shown in FIG. 1B.

The controller 5-1 can execute the operation shown in FIG. 1B. Note that the arrangement of the controller 5-1 is merely an example, and the controller 5-1 can take another arrangement for executing the operation shown in FIG. 1B.

An example of the destructive read-out memory cell will be explained.

An example of the destructive read-out memory cell is a ferroelectric memory cell (to be referred to as a FeRAM cell hereinafter).

Figure 3A:
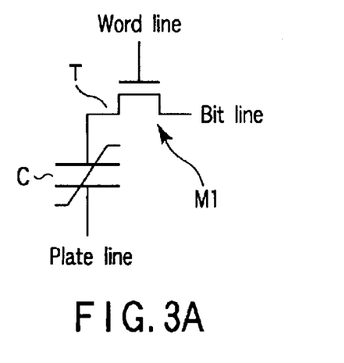
FIG. 3A is an equivalent circuit diagram showing the first example of a FeRAM cell.
Figure 3B:
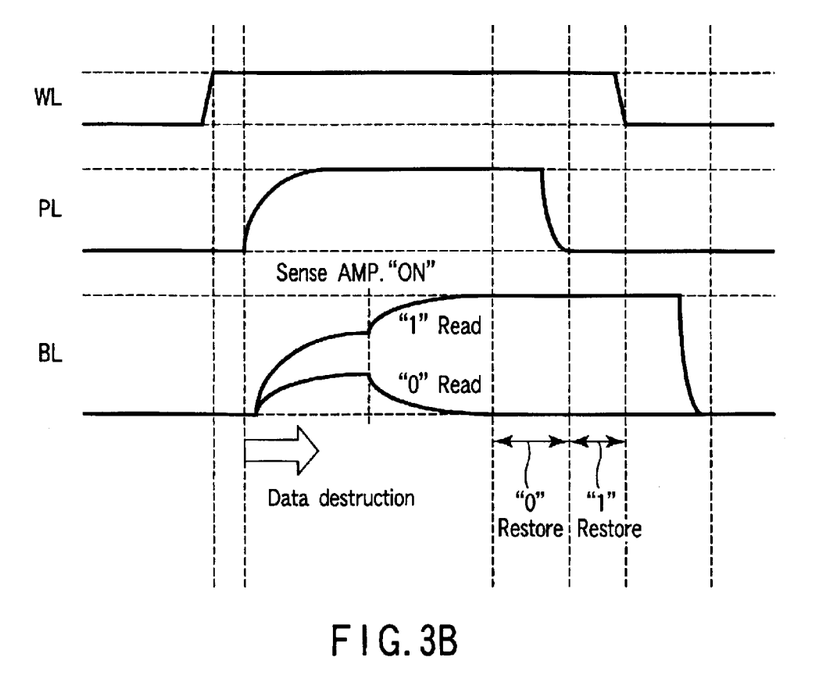
FIG. 3B is an operation waveform chart showing an example of the operation of the FeRAM cell.

FIG. 3A is an equivalent circuit diagram showing the first example of the FeRAM cell, and FIG. 3B is an operation waveform chart showing an example of the operation.

A FeRAM cell (M1) shown in FIG. 3A includes one cell transistor (T) and one ferroelectric capacitor (C). The gate of the cell transistor (T) is connected to a word line; its drain, to a bit line; and its source, to one electrode of the ferroelectric capacitor (C). The other electrode of the ferroelectric capacitor (C) is connected to a plate line. The FeRAM cell (M1) of this type is generally called a 1-transistor/1-capacitor (1T1C) FeRAM cell.

The first embodiment is based on the premise that no cell data is destructed only by activating the word line, e.g., changing the word line potential to "High" level. To satisfy this premise, the first embodiment adopts a method of making the bit line potential and plate line potential equal to each other when the word line potential changes at the first time, as shown in the operation waveform chart of FIG. 3B. According to this method, merely changing the word line potential does not apply any voltage to the ferroelectric capacitor (C) and does not destruct cell data.

Figure 4A:
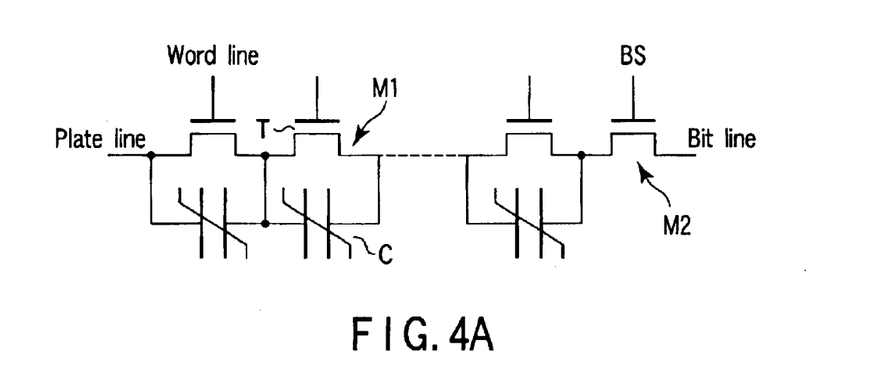
FIG. 4A is an equivalent circuit diagram showing the second example of the FeRAM cell.
Figure 4B:
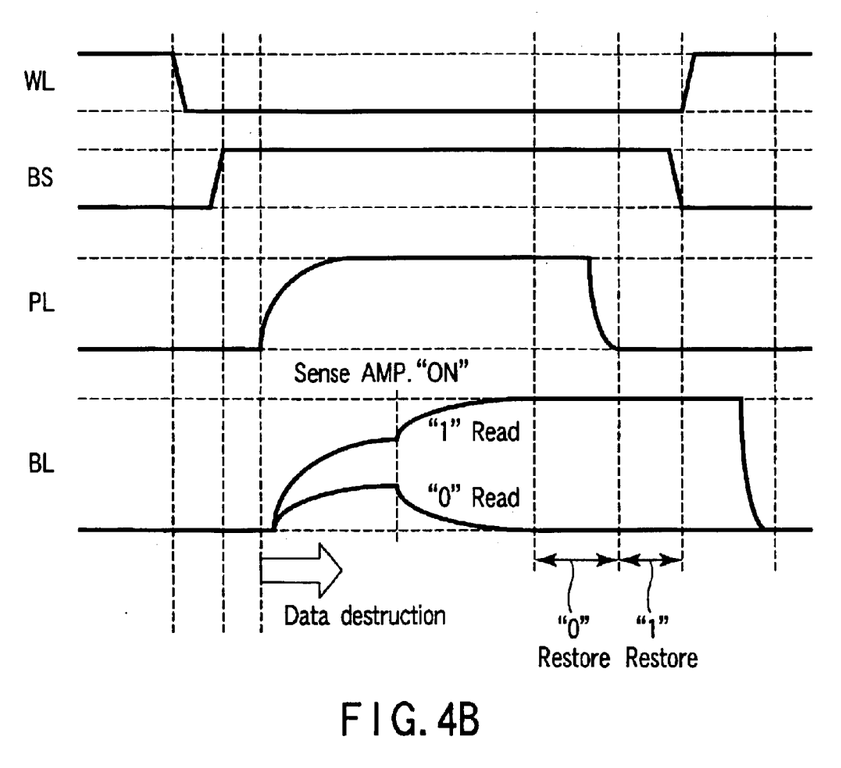
FIG. 4B is an operation waveform chart showing an example of the operation of the FeRAM cell.

FIG. 4A is an equivalent circuit diagram showing the second example of the FeRAM cell, and FIG. 4B is an operation waveform chart showing an example of the operation.

A FeRAM cell (M1) shown in FIG. 4A is a memory which consists of series connected memory cells each having a transistor having a source terminal and a drain terminal and a ferroelectric capacitor inbetween the two terminals, hereafter named "Series connected TC unit type ferroelectric RAM.

Also in this method, no voltage is applied to the ferroelectric capacitor (C) and no cell data is destructed even if the word line potential temporarily changes unless a block selection transistor M2 is turned on, as shown in the operation waveform chart of FIG. 4B.

An arrangement of the memory array 2 will be explained.

Figure 5:
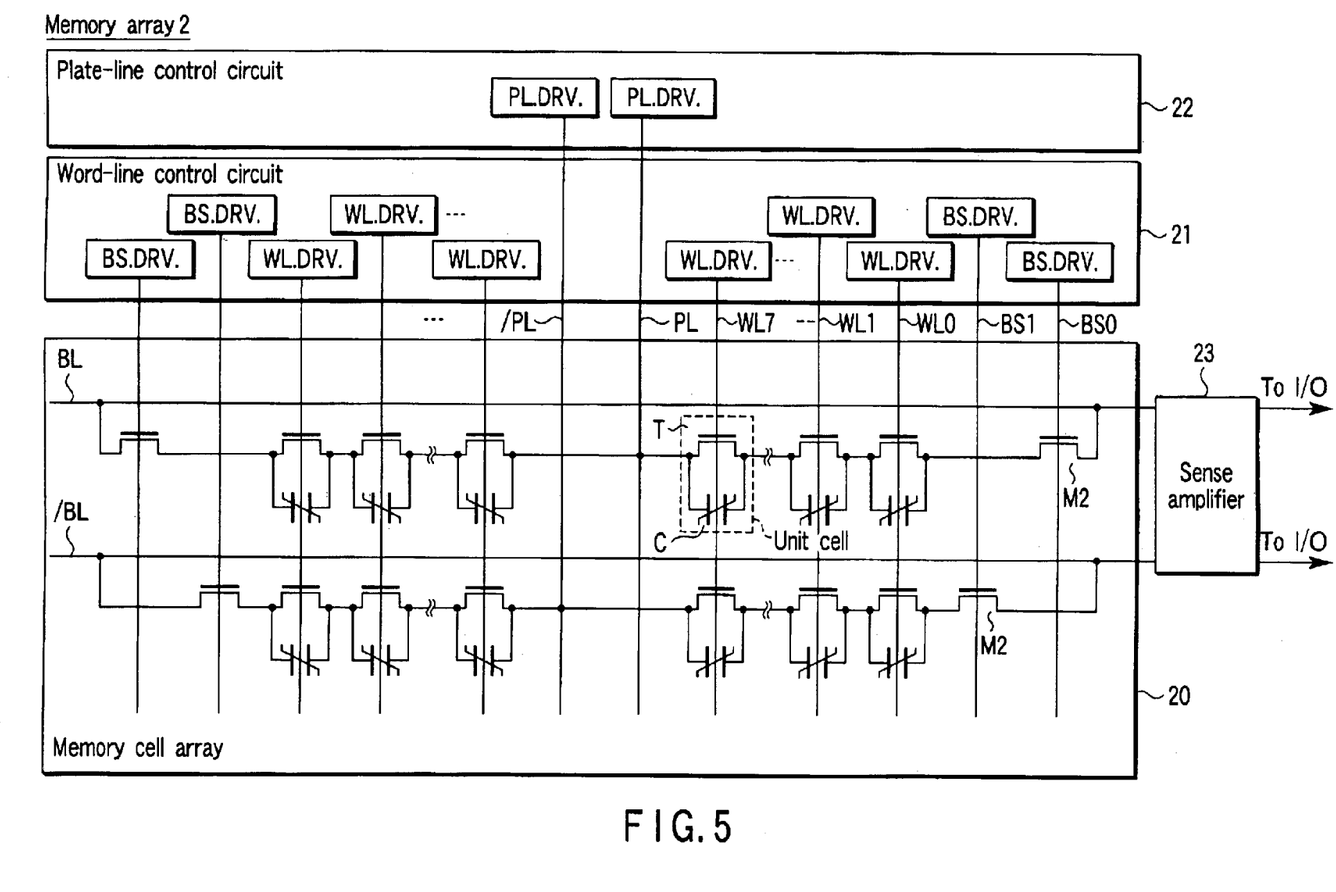
FIG. 5 is a block diagram showing an example of a memory array.

FIG. 5 is a block diagram showing an arrangement of the memory array 2. In this arrangement, a series connected TC unit type ferroelectric RAM will be exemplified. Only circuit blocks of the memory array 2 that concern the operation waveform chart shown in FIG. 4B are illustrated, and the remaining circuit blocks will be omitted.

As shown in FIG. 5, the memory array 2 includes a memory cell array 20, word-line control circuit 21, plate-line control circuit 22, and sense amplifier 23.

In the memory cell array 20, series connected TC unit type ferroelectric RAMs are integrated. Word lines WL (WL0 to WL7) are connected to the gates of cell transistors (T) and to the word-line drivers (WL.DRV) of the word-line control circuit 21. Block selection lines BS (BS0 and BS1) are connected to the gates of block selection transistors M2 and to the block-selection-line drivers (BS.DRV) of the word-line control circuit 21. Plate lines PL (PL and /PL) are connected to, e.g., the sources of the series connected TC unit type ferroelectric RAMs and to the plate-line drivers (PL.DRV) of the plate-line control circuit 22. Bit lines BL (BL and /BL) are connected to, e.g., the drains of the block selection transistors M2 and to the sense amplifier 23. The sense amplifier 23 detects whether the potential difference between the bit lines BL and /BL is, e.g., at "0" or "1" read level in data read, as shown in FIG. 4B. The sense amplifier 23 amplifies the bit line potential to "Low" level for "0" read level and to "High" level for "1" read level. Data amplified by the sense amplifier 23 is supplied to an output buffer via an internal data line (not shown), and output as output data from an output buffer to the outside of the chip.

In the semiconductor integrated circuit device according to the first embodiment, the destructive read-out semiconductor memory which operates in response to transition of an external address signal parallel-executes processing of waiting for the skew of an address signal and processing of performing address decode, achieving a high operation speed. For example, in the first embodiment, the operation progresses up to destruction of cell data, e.g., activation of a plate line or ON operation of a block selection transistor after transition of an external address signal is detected. More specifically, the operation progresses up to activation of a word line after transition of an external address signal is detected. This operation is performed parallel to wait processing of keeping the address buffer 3 in the wait state until the lapse of the skew time after transition of an external address signal is detected. Hence, the asynchronous memory interface which starts operation in response to transition of an external address signal can obtain the same performance as that of the synchronous memory interface which starts operation in synchronism with, e.g., a chip enable signal.

Second Embodiment

Figure 6:
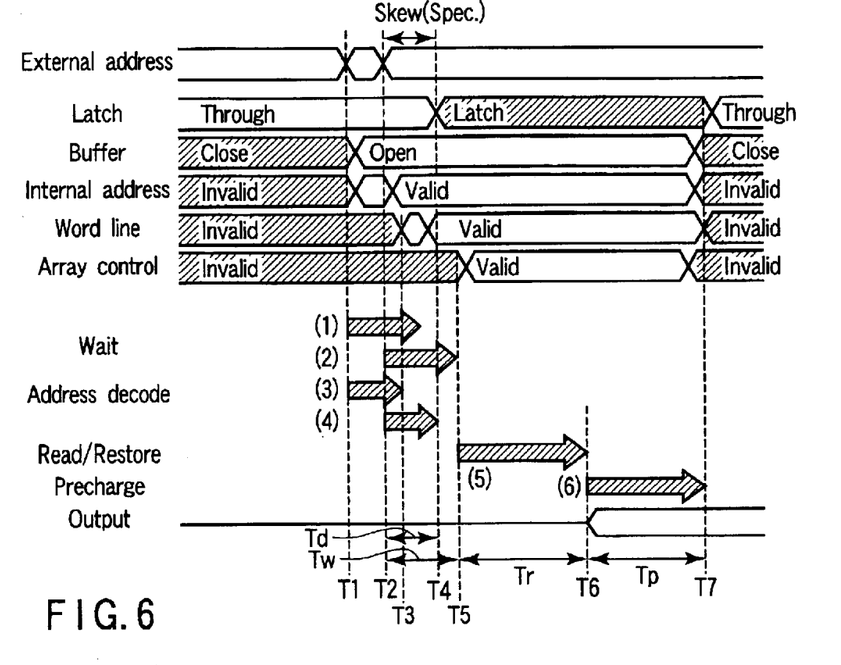
FIG. 6 is a signal transition diagram showing an operation of a semiconductor integrated circuit device according to the second embodiment of the present invention.

FIG. 6 is a signal transition diagram showing an operation of a semiconductor integrated circuit device according to the second embodiment of the present invention.

The second embodiment is different from the first embodiment in that a time necessary for wait processing, i.e., the skew time Tw is longer than a time necessary for decode processing, i.e., the decode time Td, as shown in FIG. 6. The remaining arrangement and premise are the same as those of the first embodiment.

In the second embodiment, decode processing (arrow (4)) corresponding to the second external address transition ends at time T4. At time T5 upon the lapse of the skew time Tw, the latch of an address buffer 3 is changed to the latch state, and control of a memory array 2 starts.

As a result, the access time is the skew time Tw+the read/restore time Tr. The cycle time is the skew time Tw+the read/restore time Tr+the precharge time Tp.

In the second embodiment, the asynchronous memory interface requires another time (Tw−Td), compared to the synchronous memory interface, but can be increased in speed by the time Td, compared to the conventional asynchronous memory interface.

An example of a controller 5 according to the second embodiment will be described.

Figure 7:
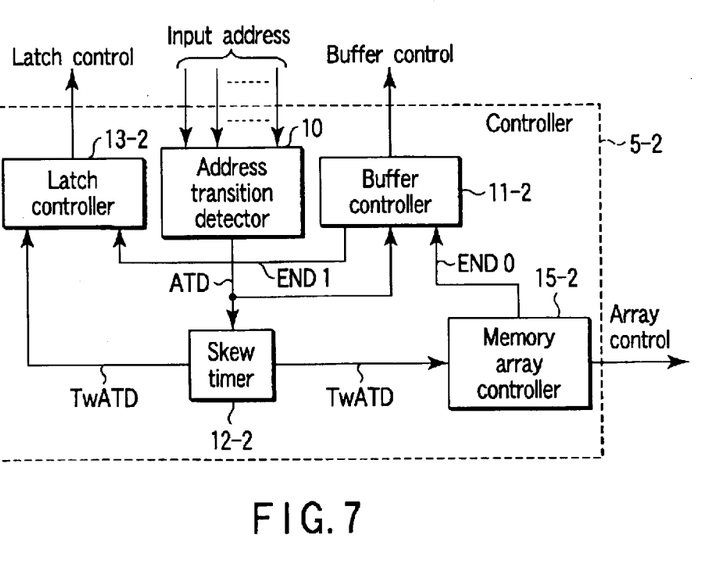
FIG. 7 is a block diagram showing an arrangement of the controller of the semiconductor integrated circuit device according to the second embodiment of the present invention.

FIG. 7 is a block diagram showing an example of the controller of the semiconductor integrated circuit device according to the second embodiment of the present invention.

As shown in FIG. 7, a controller 5-2 according to the second embodiment is different from the controller 5-1 shown in FIG. 2 in that only a skew timer 12-2 is adopted without any decode timer 14-1. In the second embodiment, the skew time Tw is longer than the decode time Td, and decode processing has already ended upon the lapse of the skew time Tw. The skew time Tw is measured to control a latch controller 13-2 and memory array controller 15-2 on the basis of the measured skew time Tw. The latch controller 13-2 receives a signal TwATD and activates a latch control signal. The memory array controller 15-2 receives the signal TwATD and activates a memory array control signal.

The remaining arrangement is the same as that of the controller 5-1.

The controller 5-2 can execute the operation shown in FIG. 6. Note that the arrangement of the controller 5-2 is merely an example, and the controller 5-2 can take another arrangement for executing the operation shown in FIG. 6.

Third Embodiment

Figure 8:
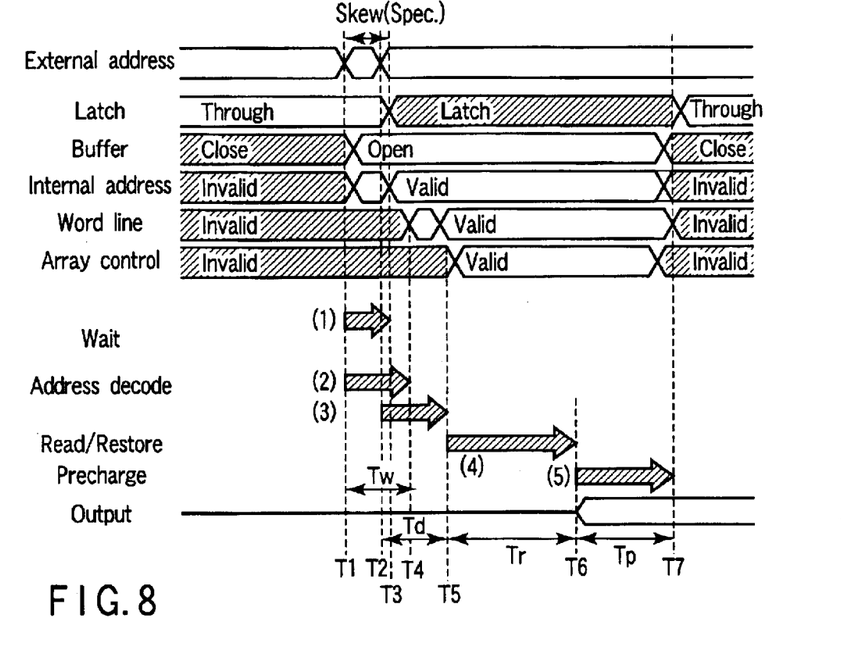
FIG. 8 is a signal transition diagram showing an operation of a semiconductor integrated circuit device according to the third embodiment of the present invention.

FIG. 8 is a signal transition diagram showing an operation of a semiconductor integrated circuit device according to the third embodiment of the present invention.

The third embodiment is different from the first embodiment in that wait processing is kept executed until the lapse of the skew time after the first transition of an external address signal is detected, as shown in FIG. 8. The remaining arrangement and premise are the same as those of the first embodiment.

In the third embodiment, since the skew time Tw has elapsed after transition of an external address when decode processing ends once or more, control of a memory array 2 starts, similar to the first embodiment. Thus, the access and cycle times are the same as those of the first embodiment.

The first embodiment can be modified similarly to the third embodiment.

An example of a controller 5 according to the third embodiment will be described.

Figure 9:
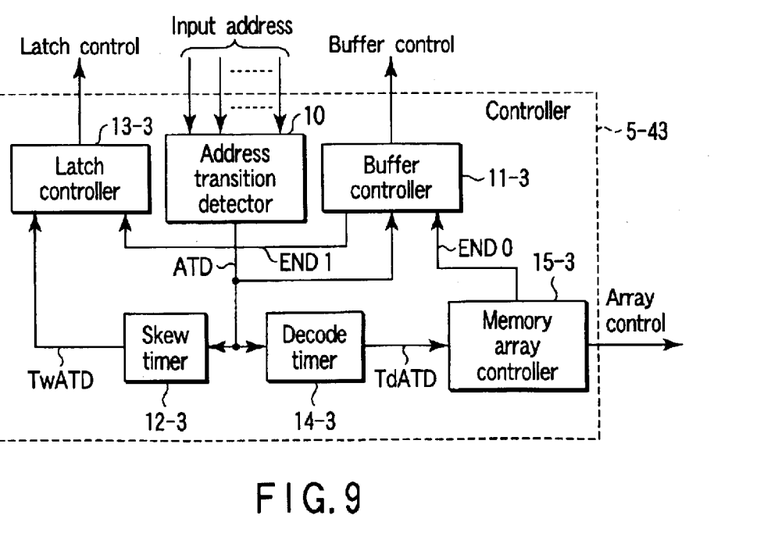
FIG. 9 is a block diagram showing an arrangement of the controller of the semiconductor integrated circuit device according to the third embodiment of the present invention.

FIG. 9 is a block diagram showing an example of the controller of the semiconductor integrated circuit device according to the third embodiment of the present invention.

As shown in FIG. 9, a controller 5-3 according to the third embodiment is different from the controller 5-1 shown in FIG. 2 in that a skew timer 12-3 measures the skew time Tw on the basis of detection of the first transition of an external address signal, and even if the next transition occurs during measurement, measurement of the skew time Tw based on detection of the first transition continues. The skew timer 12-3 can therefore output a signal TdATD based on detection of the first transition.

The remaining arrangement is the same as that of the controller 5-1.

The controller 5-3 can execute the operation shown in FIG. 8. Note that the arrangement of the controller 5-3 is merely an example, and the controller 5-3 can take another arrangement for executing the operation shown in FIG. 8.

Fourth Embodiment

Figure 10:
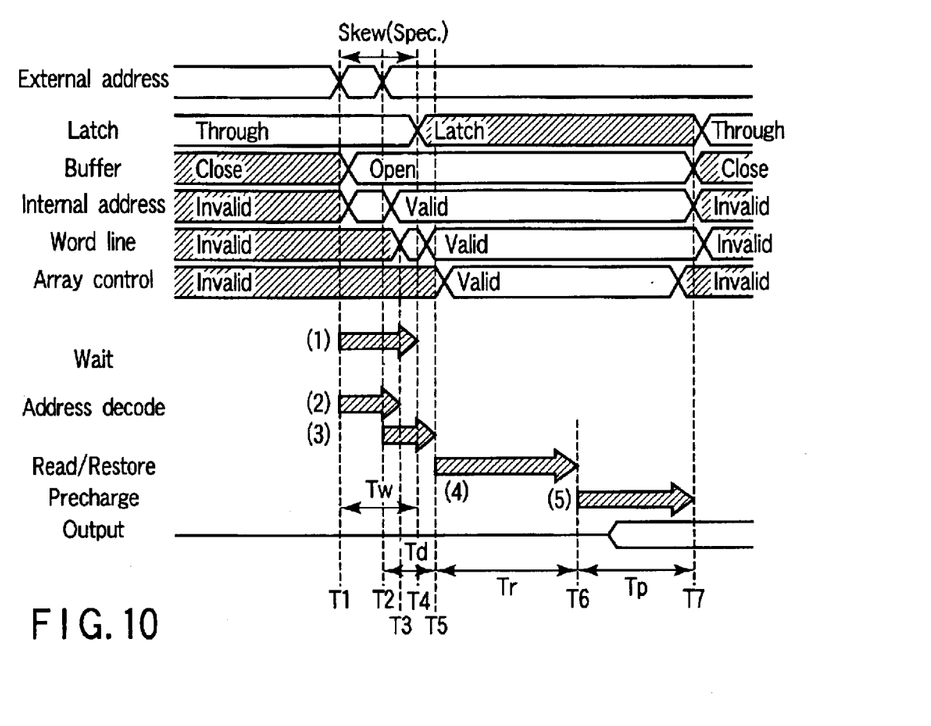
FIG. 10 is a signal transition diagram showing an operation of a semiconductor integrated circuit device according to the fourth embodiment of the present invention.

FIG. 10 is a signal transition diagram showing an operation of a semiconductor integrated circuit device according to the fourth embodiment of the present invention.

The fourth embodiment is a combination of the second and third embodiments, as shown in FIG. 10. In the fourth embodiment, as well as the third embodiment, wait processing is kept executed until the lapse of the skew time after the first transition of an external address signal is detected. The remaining arrangement and premise are the same as those of the second embodiment.

In the fourth embodiment, the skew time Tw has elapsed at time T4, and decode processing ends at time T5. If the external address changes only once at time T1, decode processing ends at time T3.

That is, in the fourth embodiment, memory array control starts after the skew time Tw has elapsed and decode processing ends. Only one transition of the external address results in the same access and cycle times as those of the second embodiment.

If the external address changes twice or more, memory array control can start at the end of decode processing corresponding to the final transition of the external address before the lapse of the skew time Tw. When, therefore, the external address changes twice or more, the access and cycle times advantageously become shorter than those in the second embodiment.

An example of a controller 5 according to the fourth embodiment will be described.

Figure 11:
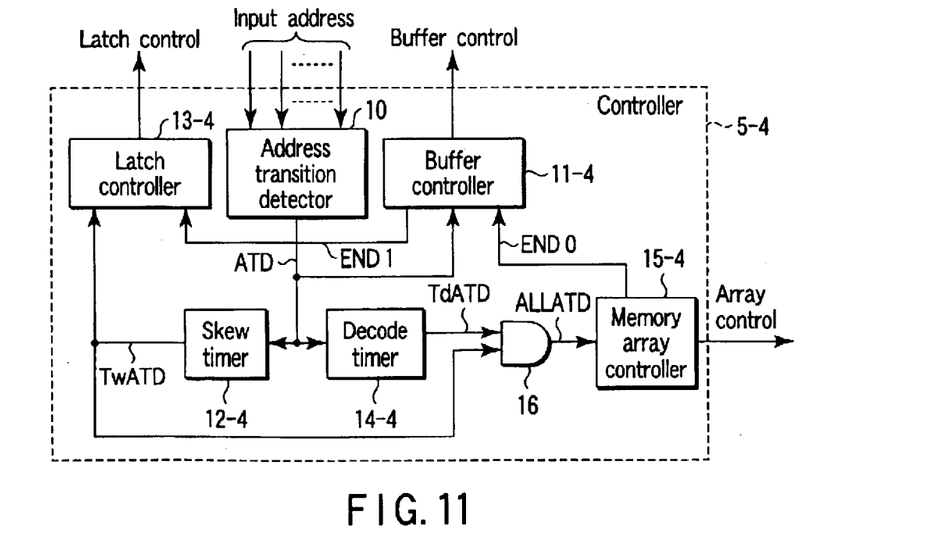
FIG. 11 is a block diagram showing an arrangement of the controller of the semiconductor integrated circuit device according to the fourth embodiment of the present invention.

FIG. 11 is a block diagram showing an example of the controller of the semiconductor integrated circuit device according to the fourth embodiment of the present invention.

As shown in FIG. 11, a controller 5-4 according to the fourth embodiment is different from the controller 5-2 shown in FIG. 7 in that a decode timer 14-4 and detection circuit 16 are arranged, and a memory array controller 15-4 receives a signal ALLATD from the detection circuit 16 and changes a memory array control signal from the invalid state to the valid state.

The detection circuit 16 receives both a signal TwATD from a skew timer 12-4 and a signal TdATD from the decode timer 14-4. The detection circuit 16 detects the lapse of the skew time Tw and the end of decode processing, and outputs the signal ALLATD.

The remaining arrangement is the same as that of the controller 5-2.

The controller 5-4 can execute the operation shown in FIG. 10. Note that the arrangement of the controller 5-4 is merely an example, and the controller 5-4 can take another arrangement for executing the operation shown in FIG. 10.

Fifth Embodiment

Figure 12:
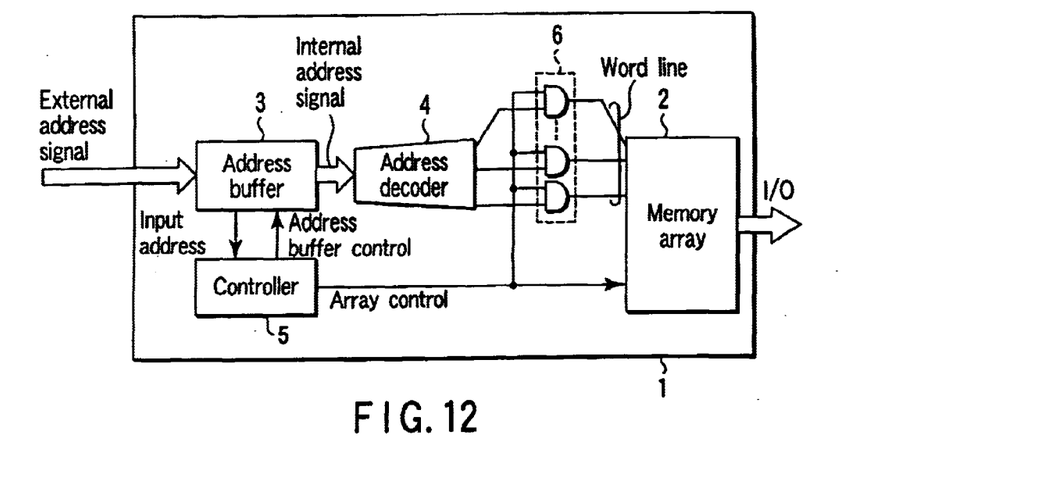
FIG. 12 is a block diagram showing a semiconductor integrated circuit device according to the fifth embodiment of the present invention.

FIG. 12 is a block diagram showing a semiconductor integrated circuit device according to the fifth embodiment of the present invention.

The fifth embodiment is different from the first embodiment in that a word-line activation enable circuit 6 is interposed between an address decoder 4 and a word line, as shown in FIG. 12.

The word-line activation enable circuit 6 receives, e.g., a memory array control signal (Array Control), and when the memory array control signal is valid, supplies a memory cell selection signal output from the address decoder 4 to the word line.

The fifth embodiment has the following advantages.

The first to fourth embodiments use, e.g., a FeRAM cell and are based on the premise that no cell data is destructed only by a change in word line potential.

However, some semiconductor memories using destructive read-out memory cells destruct cell data merely by a change in word line potential. Examples of such a semiconductor memory are a DRAM, and a FeRAM in which the plate line is activated faster than the word line.

If the word line potential changes in this semiconductor memory, cell data is destructed. For such a semiconductor memory, operation up to output of a memory cell selection signal from the address decoder 4 is done, and final control of the word line potential is performed based on, e.g., the memory array control signal.

The fifth embodiment is an application of the methods described in the first to fourth embodiments to a semiconductor memory in which merely a change in word line potential destructs cell data.

The word-line activation enable circuit 6 may be added to a circuit connected to a word line such as a word-line driver or may be integrated with, e.g., the word-line driver.

The present invention has been described by the first to fifth embodiments. However, the present invention is not limited to these embodiments, and can be variously modified without departing from the spirit or scope of the present invention in practical use.

For example, the FeRAM cell has been exemplified as a destructive read-out memory cell, but the memory cell suffices to be a destructive read-out memory cell. For example, a DRAM cell and MRAM cell can be used.

The above-described embodiments can be singly practiced, but can also be appropriately combined.

Each of the above-described embodiments includes inventions in various stages, and inventions in various stages can be extracted by an appropriate combination of building components disclosed in each embodiment.

In each embodiment, the present invention is applied to a destructive read-out semiconductor memory. In addition, a semiconductor integrated circuit device such as a processor or system LSI which incorporates the above-described destructive read-out semiconductor memory also falls within the spirit or scope of the present invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
   a memory array which includes a memory cell array in which destructive read-out memory cells are integrated;
   an address buffer which outputs an internal address signal corresponding to an input external address signal;

an address decoder which decodes the internal address signal and outputs a memory cell selection signal for selecting the memory cell in the memory cell array on the basis of a decode result; and a controller which parallel-executes wait processing of keeping the address buffer in a wait state until lapse of a skew time after transition of the external address signal is detected, and decode processing until the memory cell selection signal changes from an invalid state to a valid state in response to output of the internal address signal.

2. The device according to claim 1, wherein both the wait processing and the decoder processing start when transition of the external address signal is detected.

3. The device according to claim 1, wherein the controller changes a memory array control signal for controlling the memory array from the invalid state to the valid state after both the wait processing and the decode processing end.

4. The device according to claim 1, wherein a time necessary for the wait processing is shorter than a time necessary for the decode processing, and the controller changes a memory array control signal for controlling the memory array from the invalid state to the valid state after the decode processing ends.

5. The device according to claim 1, wherein a time necessary for the wait processing is longer than a time necessary for the decode processing, and the controller changes a memory array control signal for controlling the memory array from the invalid state to the valid state after the wait processing ends.

6. The device according to claim 3, wherein the wait processing is kept executed until the lapse of the skew time after final transition of the external address signal is detected.

7. The device according to claim 4, wherein the wait processing is kept executed until the lapse of the skew time after final transition of the external address signal is detected.

8. The device according to claim 5, wherein the wait processing is kept executed until the lapse of the skew time after final transition of the external address signal is detected.

9. The device according to claim 3, wherein the wait processing is kept executed until the lapse of the skew time after first transition of the external address signal is detected.

10. The device according to claim 4, wherein the wait processing is kept executed until the lapse of the skew time after first transition of the external address signal is detected.

11. The device according to claim 5, wherein the wait processing is kept executed until the lapse of the skew time after first transition of the external address signal is detected.

12. The device according to claim 1, wherein the destructive read-out memory cell includes a capacitor.

13. The device according to claim 12, wherein the capacitor includes a ferroelectric capacitor.

14. The device according to claim 1, wherein the memory cell selection signal is supplied to a word line of the memory cell array.

15. The device according to claim 14, wherein the memory cell includes a ferroelectric memory cell in which one end of a current path is coupled to a plate line and the other end of the current path is coupled to a bit line, and the plate line is activated after the memory cell selection signal is supplied to the word line.

16. The device according to claim 14, wherein the memory cell includes a ferroelectric memory cell in which one end of a current path is coupled to a plate line and the other end of the current path is coupled to a bit line via a selection transistor, the selection transistor is turned on after the memory cell selection signal is supplied to the word line, and the plate line is activated after the memory cell selection signal is supplied to the word line.

17. The device according to claim 1, wherein the controller changes a memory array control signal for controlling the memory array from the invalid state to the valid state after both the wait processing and the decode processing end, and the memory cell selection signal is supplied to a word line of the memory cell array after the memory array control signal changes from the invalid state to the valid state.

18. The device according to claim 17, which further comprises a word-line activation enable circuit, and in which the word-line activation enable circuit detects that the memory array control signal changes from the invalid state to the valid state, and supplies the memory cell selection signal to the word line of the memory cell array.

* * * * *